(12) United States Patent
Kato et al.

(10) Patent No.: US 6,455,883 B2
(45) Date of Patent: Sep. 24, 2002

(54) NONVOLATILE SEMICONDUCTOR MEMORY

(75) Inventors: Yoshihisa Kato, Shiga (JP); Yasuhiro Shimada, Kyoto (JP)

(73) Assignee: Matsushita Electric Industrial Co., Ltd. (JP)

( * ) Notice: Subject to any disclaimer, the term of this patent is extended or adjusted under 35 U.S.C. 154(b) by 0 days.

(21) Appl. No.: 09/879,081

(22) Filed: Jun. 13, 2001

(30) Foreign Application Priority Data

Jun. 19, 2000 (JP) .................................... 2000-182643

(51) Int. Cl.$^7$ ............................................. H01L 29/72
(52) U.S. Cl. .................. 257/295; 257/364; 257/405; 257/410
(58) Field of Search ............................. 257/295, 296, 257/364, 405, 410

(56) References Cited

U.S. PATENT DOCUMENTS 6,225,654 B1 * 5/2001 Evans et al. ................. 257/296

* cited by examiner

Primary Examiner—Edward Wojciechowicz
(74) Attorney, Agent, or Firm—Nixon Peabody LLP; Donald R. Studebaker

(57) ABSTRACT

A source region and a drain region are formed in a silicon substrate, a dielectric film is formed above a region of the silicon substrate between the source region and the drain region, a ferroelectric film is formed on the dielectric film, and a gate electrode is formed on the ferroelectric film. The ferroelectric film and the silicon substrate have a first conductivity type, and the source region and the drain region has a second conductivity type.

2 Claims, 6 Drawing Sheets

NONVOLATILE SEMICONDUCTOR MEMORY

BACKGROUND OF THE INVENTION

The present invention relates to a nonvolatile semiconductor memory using a ferroelectric capacitor for controlling the gate potential of a field effect transistor (FET).

In a conventional nonvolatile ferroelectric memory using a ferroelectric capacitor for controlling the gate potential of a FET, a source region 2 and a drain region 3 are formed in a silicon substrate 1 and a silicon oxide film 5 serving as a dielectric film is formed on a channel region 4 formed between the source region 2 and the drain region 3 in the silicon substrate 1 as shown in FIG. 4. A ferroelectric film 6 of a metal oxide such as lead zirconate titanate (PZT) or bismuth tantalate—strontium (SBT) is formed on the silicon oxide film 5, and a gate electrode 7 is formed on the ferroelectric film 6.

In the ferroelectric memory, upward or downward polarization can be caused in the ferroelectric film 6, and the depth of the surface potential of a region in the silicon substrate 1 below the gate electrode 7 can be set to two different values respectively corresponding to the two polarized states of the ferroelectric film 6.

In this case, the depth of the surface potential of the region in the silicon substrate 1 below the gate electrode 7 (namely, the channel region) controls the resistance between the source region 2 and the drain region 3, and hence, the resistance between the source region 2 and the drain region 3 is set to a large value or a small value correspondingly to the polarization direction of the ferroelectric film 6. These states are kept (stored) as far as the polarization of the ferroelectric film 6 is kept, and thus, the ferroelectric memory works as a nonvolatile memory.

For storing any of two logic states in the ferroelectric memory or reading any of the two logic states from the ferroelectric memory, for example, the downward polarized state of the ferroelectric film 6 is assumed logic "1" and the upward polarized state thereof is assumed logic "0".

In order to turn the polarization of the ferroelectric film 6 downward to write a data (of logic "1") in the ferroelectric memory, a large positive voltage is applied to the gate electrode 7 with the silicon substrate 1 set to the ground potential. On the other hand, in order to turn the polarization of the ferroelectric film 6 upward to write a data (of logic "0") in the ferroelectric memory, a large negative voltage is applied to the gate electrode 7 with the silicon substrate 1 set to the ground potential. Thereafter, the potential of the gate electrode 7 is rapidly changed to the ground potential due to a junction leakage current of the FET, namely, a potential difference between the gate electrode 7 and the silicon substrate 1 is rapidly eliminated, and thus, the written data is kept.

The data storage state of the ferroelectric memory will now be described with reference to energy band diagrams of FIGS. 5A and 5B.

It is assumed, for example, that the silicon substrate 1 has the p-type conductivity and the source region 2 and the drain region 3 have the n-type conductivity. FIG. 5A shows energy band obtained in the ferroelectric memory by applying a positive bias voltage to the gate electrode 7 so as to turn the polarization of the ferroelectric film 6 downward (namely, to write a data of logic "1") and then changing the potential of the gate electrode 7 to the ground potential. FIG. 5B shows energy band obtained in the ferroelectric memory by applying a negative bias voltage to the gate electrode 7 so as to turn the polarization of the ferroelectric film 6 upward (namely, to write a data of logic "0") and then changing the potential of the gate electrode 7 to the ground potential. In FIGS. 5A and 5B, a reference numeral 30 denotes the direction of polarization, a reference numeral 31 denotes the conduction band of the gate electrode 7, a reference numeral 32 denotes the energy band of the ferroelectric film 6, a reference numeral 33 denotes the energy band of the silicon oxide film 5, a reference numeral 35 denotes an n-type conduction channel and a broken line denotes the Fermi level.

When the polarization of the ferroelectric film 6 is downward, a negatively ionized depletion layer extends to a deep region of the silicon substrate 1. Therefore, as shown in FIG. 5A, the n-type conduction channel 35 is formed in the region in the silicon substrate 1 below the gate electrode 7 (namely, in the channel region 4), and hence, the surface potential of the silicon substrate 1 is lower than the ground potential.

On the other hand, when the polarization of the ferroelectric film 6 is upward, holes, that is, p-type carriers, are stored in the region in the silicon substrate 1 below the gate electrode 7 (namely, in the channel region 4) and hence the n-type conduction channel is not formed in the channel region 4 as shown in FIG. 5B. Therefore, the surface potential of the silicon substrate 1 accords with the ground potential.

The surface potential of the region in the silicon substrate 1 below the gate electrode is thus different depending upon the polarization direction of the ferroelectric film 6. Therefore, when a potential difference is caused between the drain region 3 and the source region 2, a current depending upon the polarization direction flows between the drain region 3 and the source region 2. Specifically, when the surface potential of the silicon substrate 1 is lower than the ground potential (which corresponds to logic "1"), the resistance between the drain region 3 and the source region 2 is low (which corresponds to an on-state) so that a large current can flow. When the surface potential of the silicon substrate 1 accords with the ground potential (which corresponds to logic "0"), the resistance between the drain region 3 and the source region 2 is high (which corresponds to an off-state) so that a current can minimally flow. Accordingly, it can be determined that the ferroelectric memory is in an on-state (corresponding to logic "1") or an off-state (corresponding to logic "0") by measuring the magnitude of the current flowing between the drain region 3 and the source region 2.

In this manner, the logic state of the ferroelectric memory can be read by causing a potential difference between the source and the drain without applying a bias voltage to the gate electrode 7. Accordingly, the on-state of the ferroelectric memory corresponds to a depletion state of a MOS transistor.

After writing a data in the ferroelectric memory, a positive or negative bias voltage is inevitably generated in the ferroelectric film 6 as shown in FIGS. 5A and 5B. The silicon oxide film 5 and the silicon substrate 1 are supplied with potentials so as to cancel the bias voltage, and whether the ferroelectric memory is in an on-state or off-state depends upon the thus supplied potentials.

The ferroelectric film 6 is an insulating film and has resistivity of approximately $10^{15}$ $\Omega \cdot cm$ at most. Therefore, when the ferroelectric film 6 has a thickness of 100 nm, the resistance per 1 $cm^2$ of the ferroelectric film 6 is $10^7$ $\Omega$.

The ferroelectric film 6 and the gate electrode 7 have substantially the same area as shown in FIG. 4, and hence, the area of the ferroelectric film 6 and the gate electrode 7 is herein standardized to 1 cm² so as to examine the electric characteristic of the ferroelectric memory.

FIG. 6 shows an equivalent circuit of the ferroelectric memory obtained when the gate electrode 7 and the silicon substrate 1 have the ground potential. In FIG. 6, $C_{ox}$ indicates the capacitance of the silicon oxide film 5, $C_F$ indicates the capacitance of the ferroelectric film 6 and $R_F$ indicates the internal resistance of the ferroelectric film 6. The value of $C_{ox}$ is 0.1 $\mu$ F/cm² at most, which is substantially equal to the capacitance of a silicon oxide film of a standard MOS transistor, and the value of $C_F$ is 1 $\mu$ F/cm². Therefore, the parallel capacitance of these capacitances is approximately 1 $\mu$ F/cm². The value of $R_F$ is $10^7$ Ω as described above. Accordingly, the virtual floating potential at a point A in the equivalent circuit of FIG. 6 is exponentially lowered by discharging the capacitance $C_{ox}$ and the capacitance $C_F$ through the resistance $R_F$. The time constant obtained in this case is $(C_{ox}+C_F) \times R_F$, that is, approximately 10 seconds. The actual time constant tends to be larger due to trapping in the gate electrode 7 and the shift from the ohm conductivity at a low voltage, and still, the upper limit of the time constant obtained through an experiment is $10^3$ seconds at most.

This means that the bias voltage applied to the ferroelectric film 6 is lost so as to eliminate the conduction channel within approximately $10^3$ seconds.

In order to practically use the ferroelectric memory as a nonvolatile memory, the data storage time is desired to be 10 years (=$10^8$ seconds) or more. In order to attain this data storage time, the resistivity of the ferroelectric film 6 needs to be increased to at least approximately $10^{20}$ Ω·cm, namely, to five or more figures.

However, a ferroelectric film with such large resistivity cannot be obtained at the present day, which hinders the practical use of a ferroelectric memory.

SUMMARY OF THE INVENTION

In consideration of the aforementioned circumstances, an object of the invention is providing a nonvolatile semiconductor memory capable of storing a data for a long period of time by suppressing loss of charge accompanied by a leakage current in a ferroelectric film.

In order to achieve the object, the first nonvolatile semiconductor memory of this invention comprises a source region and a drain region formed in a silicon substrate; a dielectric film formed above a region of the silicon substrate between the source region and the drain region; a ferroelectric film formed on the dielectric film; and a gate electrode formed on the ferroelectric film, and the ferroelectric film and the silicon substrate have a p-type conductivity, and the source region and the drain region have an n-type conductivity.

Also in order to achieve the object, the second nonvolatile semiconductor memory of this invention comprises a source region and a drain region formed in a silicon substrate; a dielectric film formed above a region of the semiconductor substrate between the source region and the drain region; a ferroelectric film formed on the dielectric film; and a gate electrode formed on the ferroelectric film, and the ferroelectric film and the silicon substrate have an n-type conductivity, and the source region and the drain region have a p-type conductivity.

In the first or second nonvolatile semiconductor memory of this invention, the ferroelectric film and the silicon substrate have the same conductivity type. Therefore, even when a bias voltage is applied to the ferroelectric film for writing a data, the loss of charge accompanied by a leakage current is minimally caused in the ferroelectric film because there are few carriers of charge with the same polarity as the bias voltage. Accordingly, a conduction channel formed in a surface portion of the silicon substrate can be kept for a long period of time and is constantly kept until an operation for eliminating the conduction channel is carried out. Also, after the operation for eliminating the conduction is carried out, the elimination of the conduction channel can be permanently kept.

As a result, a data can be stored for a long period of time in the first or second nonvolatile semiconductor memory of the invention.

DETAILED DESCRIPTION OF THE INVENTION

The cross-sectional structure of a nonvolatile semiconductor memory according to Embodiment 1 or 2 of the invention will now be described with reference to FIG. 1.

Figure 1:
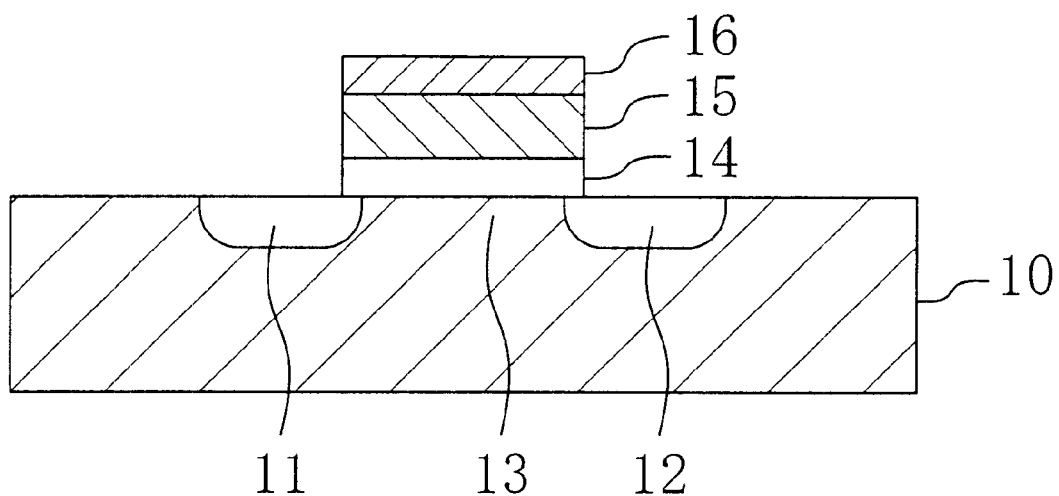
FIG. 1 is a cross-sectional view of a nonvolatile semiconductor memory according to Embodiment 1 or 2 of the invention.

FIG. 1 shows the cross-sectional structure of the nonvolatile semiconductor memory commonly employed in Embodiments 1 and 2. A source region 11 and a drain region 12 are formed in a silicon substrate 10, and a silicon oxide film 14 serving as a dielectric film is formed on a channel region 13 formed in the silicon substrate 10 between the source region 11 and the drain region 12. A ferroelectric film 15 of a metal oxide is formed on the silicon oxide film 14, and a gate electrode 16 is formed on the ferroelectric film 15.

EMBODIMENT 1

In the ferroelectric memory according to Embodiment 1 of the invention, the ferroelectric film 15 has the p-type conductivity, the silicon substrate 10 has the p-type conductivity, and the source region 11 and the drain region 12 have the n-type conductivity. Accordingly, a field effect transistor of the ferroelectric memory is an n-channel transistor.

Owing to this structure, the loss of charge accompanied by a leakage current is minimally caused in the ferroelectric film 15, so that a data can be stored for a long period of time. The reason will now be described with reference to FIGS. 2A and 2B.

Figure 2A:
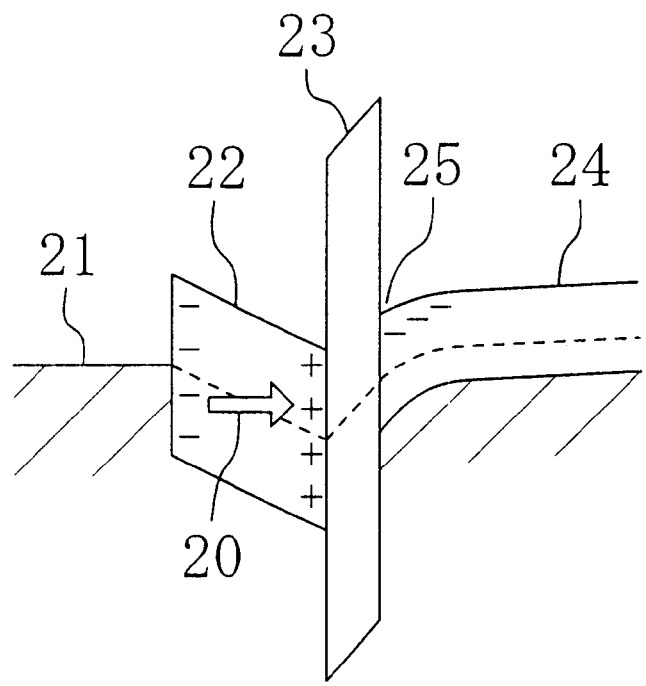
FIGS. 2A and 2B are energy band diagrams of the nonvolatile semiconductor memory of Embodiment 1 obtained in its data storage state.
Figure 2B:
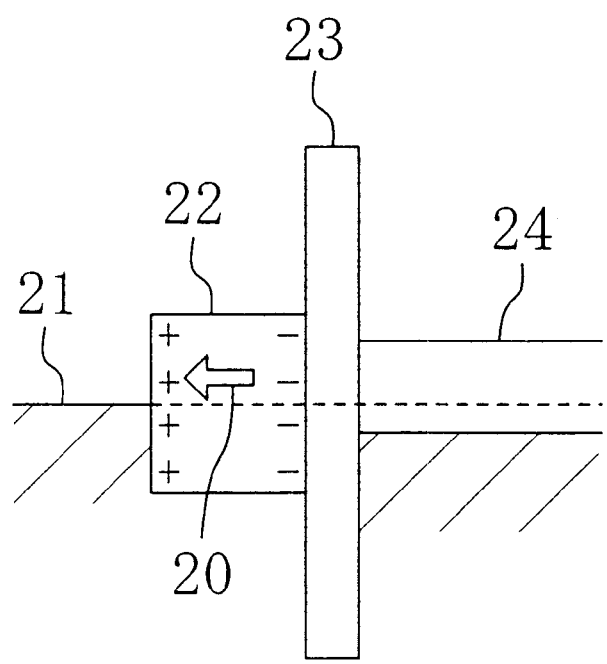

FIGS. 2A and 2B are energy band diagrams of the nonvolatile semiconductor memory of Embodiment 1, namely, the ferroelectric memory including the ferroelectric film 15 and the silicon substrate 10 both having the p-type conductivity, obtained in its data storage state.

In FIGS. 2A and 2B, a reference numeral 20 denotes the direction of polarization, a reference numeral 21 denotes the energy band of the gate electrode 16, a reference numeral 22 denotes the energy band of the ferroelectric film 15, a reference numeral 23 denotes the energy band of the silicon oxide film 14, a reference numeral 24 denotes the energy band of the p-type silicon substrate 10, and a broken line denotes the Fermi level.

Now, attention is paid to carriers of charge of a leakage current flowing through the internal resistance of the ferroelectric film 15 of the ferroelectric memory. Since the ferroelectric film 15 and the silicon oxide film 14 are in direct contact with each other, charge present on their interface is polarization charge. Accordingly, freely movable carriers are not present on the interface.

In order to place the ferroelectric memory of Embodiment 1 in an on-state, a bias voltage positive with respect to the p-type silicon substrate 10 is applied to the gate electrode 16 so as to turn the polarization of the ferroelectric film 15 downward and the bias voltage is then changed to zero. Thus, an n-type conduction channel 25 formed on the p-type silicon substrate 10 is kept as shown in FIG. 2A.

At this point, as obvious from FIG. 2A, a bias voltage negative with respect to the silicon substrate 10 is applied to the ferroelectric film 15. Since the negative bias voltage is thus applied, the carriers of charge are injected into the ferroelectric film 15 either as holes injected from the silicon oxide film 14 or as electrons injected from the gate electrode 16.

However, there is no freely movable carrier in the vicinity of the interface between the ferroelectric film 15 and the silicon oxide film 14, and therefore, holes are never injected from the silicon oxide film 14. Accordingly, the injected carriers are merely the electrons injected from the gate electrode 16.

Since the silicon substrate 10 has the p-type conductivity and the ferroelectric film 15 has the p-type conductivity in Embodiment 1, the electrons injected from the gate electrode 16 cannot be conducted through the ferroelectric film 15. Therefore, the electrons that cannot be conducted are locally present on the interface between the gate electrode 16 and the ferroelectric film 15. As a result, the surface potential of the ferroelectric film 15 with respect to the electrons is acceleratingly increased, so that the electrons cannot be actually injected.

Since the electrons are not injected from the gate electrode 16 in this manner, the bias voltage applied to the ferroelectric film 15 can be kept for a long period of time. Accordingly, the n-type conduction channel 25 formed in the surface portion of the p-type silicon substrate 10 can be kept.

In order to place the ferroelectric memory of Embodiment 1 in an off-state, a bias voltage negative with respect to the p-type silicon substrate 10 is applied to the gate electrode 16 so as to turn the polarization of the ferroelectric film 15 upward and the bias voltage is then changed to zero. Thus, the n-type conduction channel 25 formed in the surface portion of the p-type silicon substrate 10 is eliminated as shown in FIG. 2B.

At this point, the negative bias voltage applied to the gate electrode 16 is set to a sufficiently small value so as not to be applied to the ferroelectric film 15. Therefore, the energy band is substantially placed in thermal equilibrium state as shown in FIG. 2B, and hence, the elimination of the n-type conduction channel 25 can be permanently kept.

EMBODIMENT 2

In the ferroelectric memory of Embodiment 2, the ferroelectric film 15 has the n-type conductivity, the silicon substrate 10 has the n-type conductivity, and the source region 11 and the drain region 12 have the p-type conductivity. Therefore, the field effect transistor of the ferroelectric memory is a p-channel transistor.

Owing to this structure, the loss of charge accompanied by a leakage current is minimally caused in the ferroelectric film 15, so that a data can be stored for a long period of time. The reason will now be described with reference to FIGS. 3A and 3B.

Figure 3A:
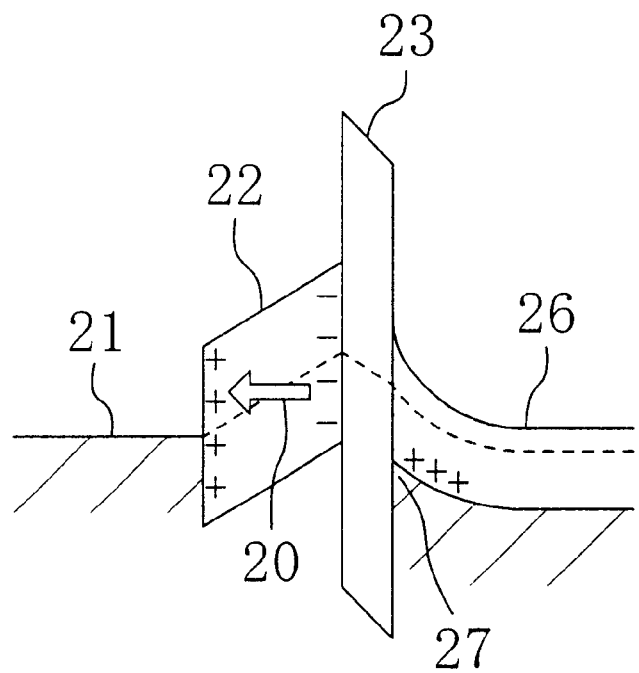
FIGS. 3A and 3B are energy band diagrams of the nonvolatile semiconductor memory of Embodiment 2 obtained in its data storage state.
Figure 3B:
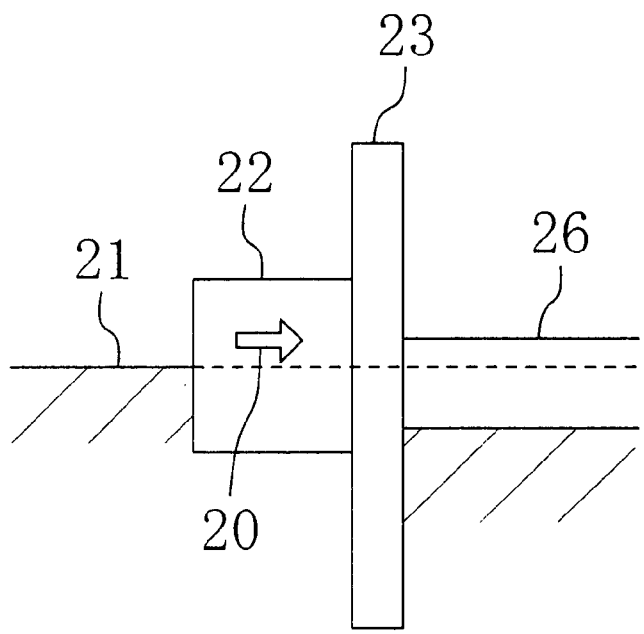
Figure 4:
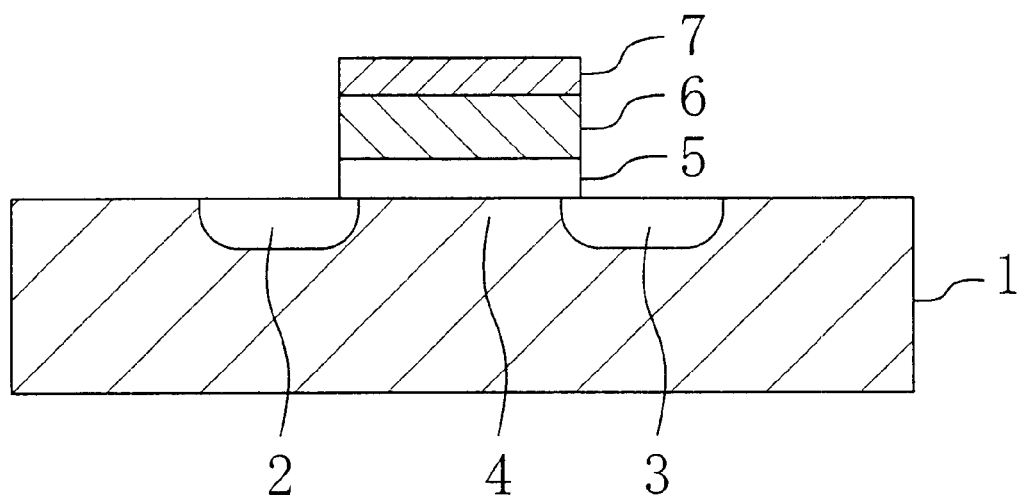
FIG. 4 is a cross-sectional view of a conventional nonvolatile semiconductor memory.
Figure 5A:
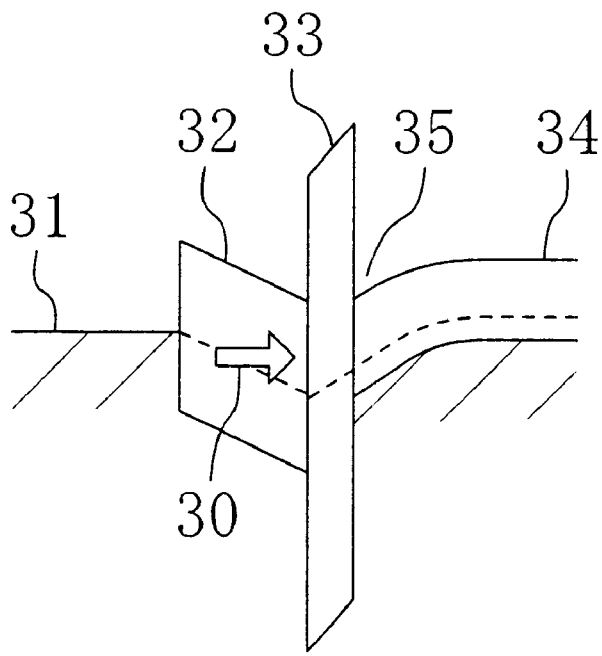
FIGS. 5A and 5B are energy band diagrams of the conventional nonvolatile semiconductor memory obtained in its data storage state.
Figure 5B:
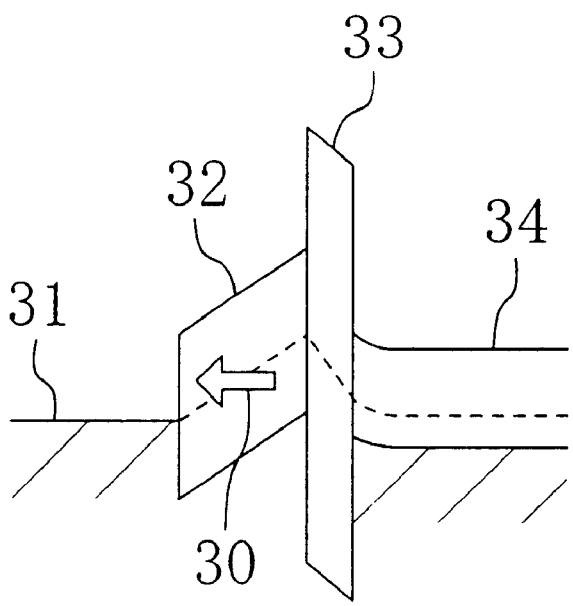
Figure 6:
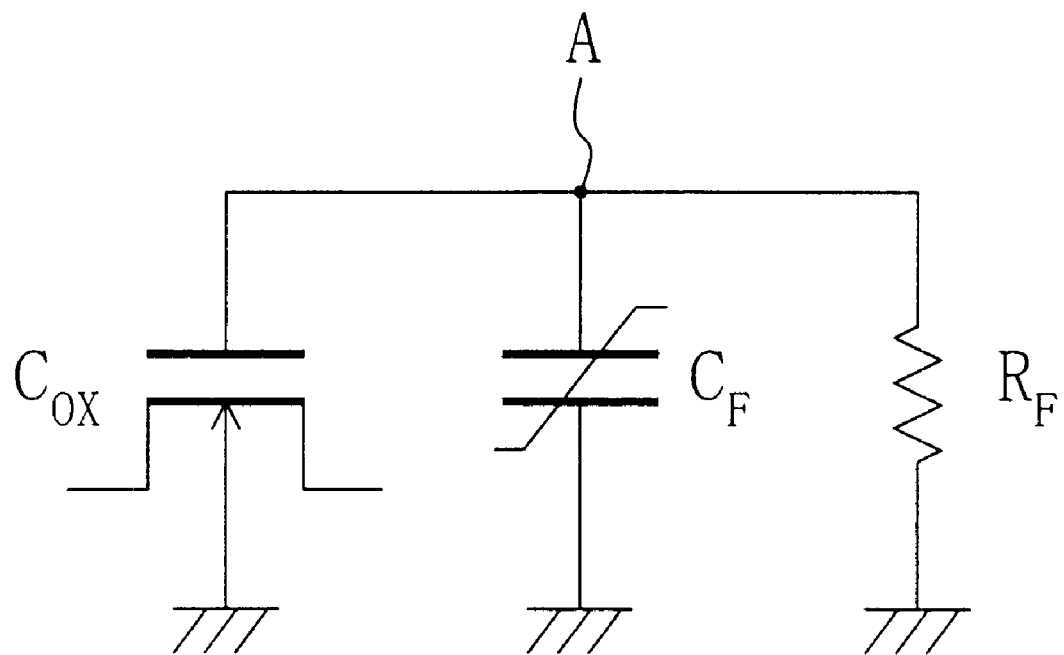
FIG. 6 is an equivalent circuit diagram of a conventional ferroelectric memory obtained when a gate electrode and a silicon substrate have the ground potential.

FIGS. 3A and 3B are energy band diagrams of the nonvolatile semiconductor memory of Embodiment 2, namely, the ferroelectric memory including the ferroelectric film 15 and the silicon substrate 10 both having the n-type conductivity, obtained in its data storage state.

In FIGS. 3A and 3B, a reference numeral 20 denotes the direction of polarization, a reference numeral 21 denotes the energy band of the gate electrode 16, a reference numeral 22 denotes the energy band of the ferroelectric film 15, a reference numeral 23 denotes the energy band of the silicon oxide film 14, a reference numeral 24 denotes the energy band of the n-type silicon substrate 10, and a broken line denotes the Fermi level.

In order to place the ferroelectric memory of Embodiment 2 in an on-state, a bias voltage negative with respect to the n-type silicon substrate 10 is applied to the gate electrode 16 so as to turn the polarization of the ferroelectric film 15 upward and the bias voltage is then changed to zero. Thus, a p-type conduction channel 27 formed in the surface portion of the n-type silicon substrate 10 is kept as shown in FIG. 3A.

At this point, as obvious from FIG. 3A, a bias voltage positive with respect to the silicon substrate 10 is applied to the ferroelectric film 15. Since the positive bias voltage is thus applied, the carriers of charge are injected into the ferroelectric film 15 either as electrons injected from the silicon oxide film 14 or as holes injected from the gate electrode 16.

However, there is no freely movable carrier in the vicinity of the interface between the ferroelectric film 15 and the silicon oxide film 14, and therefore, electrons are never injected from the silicon oxide film 14. Accordingly, the injected carriers are merely the holes injected from the gate electrode 16.

Since the silicon substrate 10 has the n-type conductivity and the ferroelectric film 15 has the n-type conductivity in Embodiment 2, the holes injected from the gate electrode 16 cannot be conducted through the ferroelectric film 15. Therefore, the holes that cannot be conducted are locally present on the interface between the gate electrode 16 and the ferroelectric film 15. As a result, the surface potential of the ferroelectric film 15 with respect to the holes is acceleratingly increased, so that the holes cannot be actually injected.

Since the holes are not injected from the gate electrode 16 in this manner, the bias voltage applied to the ferroelectric film 15 can be kept for a long period of time. Accordingly, the p-type conduction channel 27 formed in the surface portion of the n-type silicon substrate 10 can be kept.

In order to place the ferroelectric memory of Embodiment 2 in an off-state, a bias voltage positive with respect to the n-type silicon substrate 10 is applied to the gate electrode 16 so as to turn the polarization of the ferroelectric film 15 downward and the bias voltage is then changed to zero. Thus, the p-type conduction channel 27 formed in the surface portion of the n-type silicon substrate 10 is eliminated as shown in FIG. 3B.

At this point, the positive bias voltage applied to the gate electrode 16 is set to a sufficiently small value so as not to be applied to the ferroelectric film 15. Therefore, the energy band is substantially placed in thermal equilibrium state as shown in FIG. 3B, and hence, the elimination of the p-type conduction channel 27 can be permanently kept.

Accordingly, in the case where the ferroelectric film 15 is formed from, for example, a $SrBi_2(Ta, Nb)_2O_9$ film having the n-type conductivity, the data storage time can be longer when a p-channel FET is formed by using an n-type silicon substrate than when an n-channel FET is formed by using a p-type silicon substrate.

What is claimed is:

1. A nonvolatile semiconductor memory comprising:

a source region and a drain region formed in a silicon substrate;

a dielectric film formed above a region of said silicon substrate between said source region and said drain region;

a ferroelectric film formed on said dielectric film; and a gate electrode formed on said ferroelectric film, wherein said ferroelectric film and said silicon substrate have a p-type conductivity, and said source region and said drain region have an n-type conductivity.

2. A nonvolatile semiconductor memory comprising:

a source region and a drain region formed in a silicon substrate;

a dielectric film formed above a region of said semiconductor substrate between said source region and said drain region;

a ferroelectric film formed on said dielectric film; and a gate electrode formed on said ferroelectric film, wherein said ferroelectric film and said silicon substrate have an n-type conductivity, and said source region and said drain region have a p-type conductivity.

* * * * *